United States Patent
La Malfa et al.

(10) Patent No.: US 7,336,117 B2
(45) Date of Patent: Feb. 26, 2008

(54) ENHANCEMENT OF POWER ON RELIABILITY IN A DUAL POWER SUPPLY DIGITAL DEVICE WITH DOWN CONVERTER

(75) Inventors: Antonino La Malfa, Catania (IT); Marco Messina, Augusta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 39 days.

(21) Appl. No.: 11/457,634

(22) Filed: Jul. 14, 2006

(65) Prior Publication Data

US 2008/0012621 A1 Jan. 17, 2008

(51) Int. Cl.
*H03L 5/00* (2006.01)
*H03K 1/175* (2006.01)

(52) U.S. Cl. .......................... 327/333; 326/80; 326/81

(58) Field of Classification Search ................ 327/306, 327/333; 326/80, 81
See application file for complete search history.

(56) References Cited

U.S. PATENT DOCUMENTS

| | | | |
|---|---|---|---|
| 6,977,523 B2 * | 12/2005 | Tamaki | 326/68 |
| 7,088,167 B2 * | 8/2006 | Itoh | 327/333 |
| 7,148,375 B2 * | 12/2006 | Edwards et al. | 562/36 |
| 2003/0179032 A1 | 9/2003 | Kaneko et al. | 327/333 |
| 2005/0077919 A1 | 4/2005 | Sowden et al. | 326/62 |
| 2005/0122820 A1 | 6/2005 | Choi et al. | 365/226 |

* cited by examiner

*Primary Examiner*—Dinh T. Le
(74) *Attorney, Agent, or Firm*—Lisa K. Jorgenson; Allen, Dyer, Doppelt, Milbrath & Gilchrist, P.A.

(57) ABSTRACT

A dual power supply digital device includes a down converter for converting an externally applied supply voltage to a regulated first supply voltage for powering a core part of the logic circuitry of the digital device. A second supply voltage source provides a second supply voltage for powering input buffers of the I/O pads of the digital device. A voltage translator latch stage may be powered at the regulated down converted first supply voltage for replicating a stored inverted replica of a logic value present on a respective I/O pad of the digital device onto an input node of a respective second input logic buffer powered at the regulated core supply voltage. The device may further include a transistor having a turn-on threshold coupling the input node of the second buffer to the regulated down converted core supply voltage, with the transistor having a control gate connected to the second power supply source.

9 Claims, 2 Drawing Sheets

ENHANCEMENT OF POWER ON RELIABILITY IN A DUAL POWER SUPPLY DIGITAL DEVICE WITH DOWN CONVERTER

FIELD OF THE INVENTION

The present invention relates to power supplies, and more particularly, to a dual power supply digital device in which the power supply voltage for a core portion of the digital device differs from the power supply voltage of input/output (I/O) buffers, and in which the supply voltage of the core portion is internally produced by a down converter receiving an externally applied power supply voltage.

BACKGROUND OF THE INVENTION

Level shifting in data processing apparatuses is a commonly applied technique. U.S. published patent applications 2003/0179032, 2005/0077919 and 2005/0122820 each disclose level shifting circuits in integrated digital devices. Traditionally, a dual power supply digital device, for example a non-volatile flash digital device, requires dedicated circuitry for gathering external information at a certain logic reference voltage level, typically referenced to VDDQ (i.e., the voltage of the input buffers coupled to the I/O pads of the device), and for translating the voltage level to a lower logic reference voltage level. This lower voltage level corresponds to regulated power supply voltage VDDIN.

Digital devices like DRAMs, SRAMs, EPROMs, Flash-EEPROMs and similar devices, commonly supporting a 3 V power supply voltage, and are being integrated with smaller size features and with thinner dielectric layers. These digital devices include an optimized area occupancy of core logic circuitry employing transistors designed for functioning at a down converted regulated supply voltage of the core circuitry, for example 1.8 V. This has led to the integration on the chip of a down converter of an externally applied power supply voltage that may vary from about 2.7 V to about 3.6 V to a regulated core supply voltage of about 1.8 V. Such a down converting circuit commonly includes a switching mode voltage regulator capable of regulating the down converted core supply voltage with high precision.

The two externally applied power supply voltages, namely VDD and VDDQ, could be applied to the digital device with a certain time lag, one with respect to the other one. In particular, the VDDQ voltage could be applied with a certain delay as compared to VDD. Should this occur, information input to the digital device may be conveyed to the core of the digital device in an unpredictable manner because of an incorrect powering of the I/O interfacing circuitry during power on, resulting in unpredictable consequences.

FIG. 1 is a basic circuit diagram showing the down converter that converts the externally applied power supply voltage VDD to a regulated core supply voltage VDDIN=1.8, and the input interfacing circuit for an I/O input pad INPAD_N of the digital device. The dedicated interfacing circuit basically functions as a latch-type voltage translator. If INPAD_N=0, then the replicated logic on the IN_N node will be 0, referenced to the internally regulated core supply voltage VDDIN. When INPAD_N=VDDQ, the input logic value 1 will be replicated on the IN_N node, referenced to the internally regulated internal core supply voltage VDDIN.

Generally, the ranges of the two externally applied power supply voltages may typically be as follows:

| VDDQmin = 1.65 V | VDDQmax = 3.6 V |
|---|---|
| VDDmin = 2.7 V | VDDmax = 3.6 V |

In contrast, VDDIN can be assumed as practically stable at the regulated value of 1.8 V by virtue of the integrated switching mode down converter regulator that generates it.

As noted, problems may arise if VDD is present, and therefore VDDIN is also present, but the second power supply voltage VDDQ that powers the I/O buffers is not yet present. In this case, the logic level present on IN_N becomes unpredictable (floating). Such an accidental condition may be considered even more undesirable if the I/O pad in question is the one in which, for example, a write enable command WE_N is applied when the digital device is a memory device, or a global reset signal (RPM) is applied to the digital device. In both of these cases, the devices may have undesirable behaviors.

SUMMARY OF THE INVENTION

In view of the foregoing background, it is therefore an object of the invention to address the above-identified reliability problem at power on in a dual power supply digital device comprising a down converter generating a regulated core supply voltage.

The dual power supply digital device in accordance with the invention eliminates the requirement that the two externally applied supply voltages VDDQ and VDD are to be simultaneously applied. This advantageously allows the two power supply voltages to be applied in a completely uncorrelated fashion without causing spurious commands or sequences at power on.

Basically, the approach uses the addition of a single transistor to the input interfacing circuitry of an input I/O pad of the device. More particularly, the dual power supply digital device comprises a down converter for converting an externally applied supply voltage to a regulated first supply voltage for powering a core part of the logic circuitry of the digital device. A second supply voltage source may provide a second supply voltage for powering input buffers of I/O pads of the digital device. A voltage translator latch stage may be powered at the regulated down converted first supply voltage for replicating a stored inverted replica of a logic value present on a respective I/O pad of the digital device onto an input node of a respective second input logic buffer powered at the regulated core supply voltage. The device may further include at least one transistor having a turn-on threshold coupling the input node of the second buffer to the regulated down converted core supply voltage, with the at least one transistor having a control gate connected to the second power supply source.

DETAILED DESCRIPTION OF THE PREFERRED EMBODIMENTS

Figure 2:
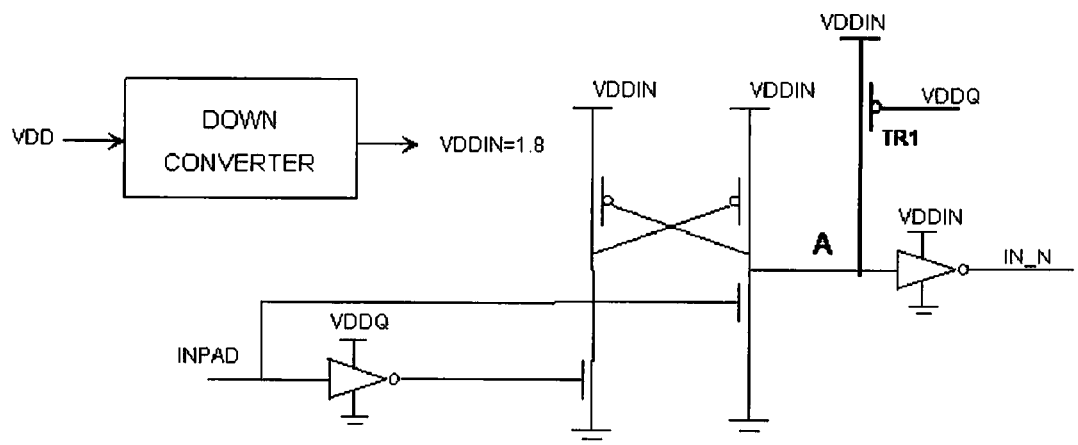
FIG. 2 shows the same basic diagram of FIG. 1 modified according to the present invention.

With reference to FIG. 2, a dual power supply digital device comprises a down converter that converts an externally applied supply voltage VDD to a regulated first supply voltage VDDIN for powering part of the logic circuitry of the digital device (i.e., core logic circuitry). A second externally applied supply voltage VDDQ is separately applied to a dedicated supply pad of the device for powering I/O buffers of the digital device. Therefore, the information acquired through an input pad INPAD_N of the device at the logic reference voltage VDDQ needs to be replicated at the down converted regulated supply voltage logic reference level VDDIN at which the core logic circuitry of the digital device is powered.

Figure 1:
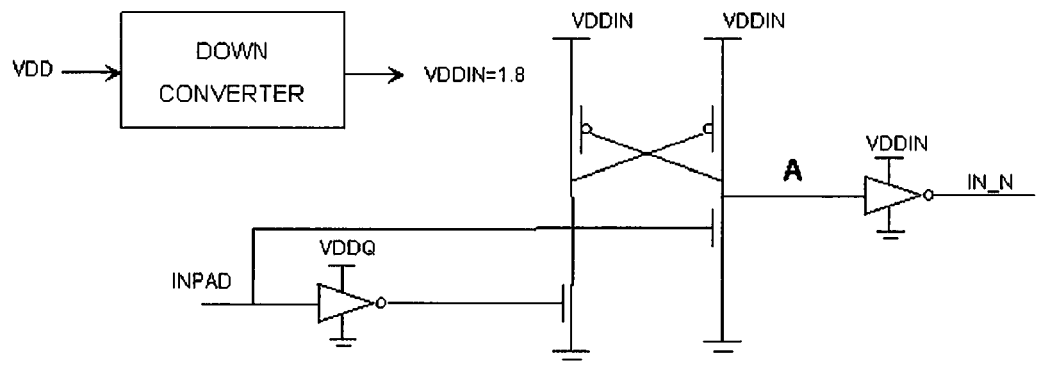
FIG. 1 is a basic circuit diagram of a down converting switching regulator for a digital device and of the input interfacing circuit for an I/O pad of the digital device according to the prior art.

As already discussed in relation to FIG. 1, this is commonly done for each input pad INPAD_N of the device by a voltage translator latch stage and by a second input buffer both powered at the regulated core supply voltage VDDIN. The latch replicates a stored inverted replica of the logic value present on the input pad INPAD_N onto the input node A of a second logic buffer powered at the regulated core supply voltage VDDIN, thus conveying the correct input logic value IN_N to the core circuitry of the digital device.

As readily identified by the portion drawn with heavier or thicker lines, a p-channel transistor TR1 having adequate voltage withstanding properties (preferably a high voltage type transistor with a threshold of about 700 mV) couples the input node A of the second buffer to the down converter core supply voltage VDDIN, and has a control gate connected to the second supply voltage VDDQ that powers the input buffers of the digital device. This addition to the logic voltage level translating circuit for the interface of each input pad of the device ensures that whenever the input node A could be floating (e.g., VDDQ=ground potential) and the second supply voltage VDDQ is finally applied to the device after having applied the VDD supply voltage, the same node A is securely in a known state, notably A=VDDIN (i.e., at the logic state 1).

If the input pin in question is the reset pin of the device, that will ensure that before its logic value at the INPAD is read at power on, the logic value seen by the digital core is IN_N=GND (i.e., a logic state 0). A low state reset value will ensure a global resetting of the digital chip that will bring it in a known and safe condition. Upon the eventual rising of the VDDQ voltage the transistor TR1 will gradually be turned off and will finally reach a nonconductive state.

As may be observed, the presence of a down converter and of the added transistor TR1 of a relatively high threshold (e.g., about 700 mV for a high voltage P-channel MOS) will further ensure that under most critical functional conditions, e.g., with a VDDQ=1.6 V, the added transistor TR1 will not adversely influence the behavior of the basic interfacing circuitry.

By considering that the switching threshold is given by $Vcomm=VDDIN-Vth_{(TR1)}$, for VDDQ<Vcomm the node A is forced to VDDIN. Therefore, for VDDQ>Vcomm, the added p-channel transistor TR1 will not condition the signal on A that will depend on the value present on the respective I/O pad, INPAD_N.

Figure 3:
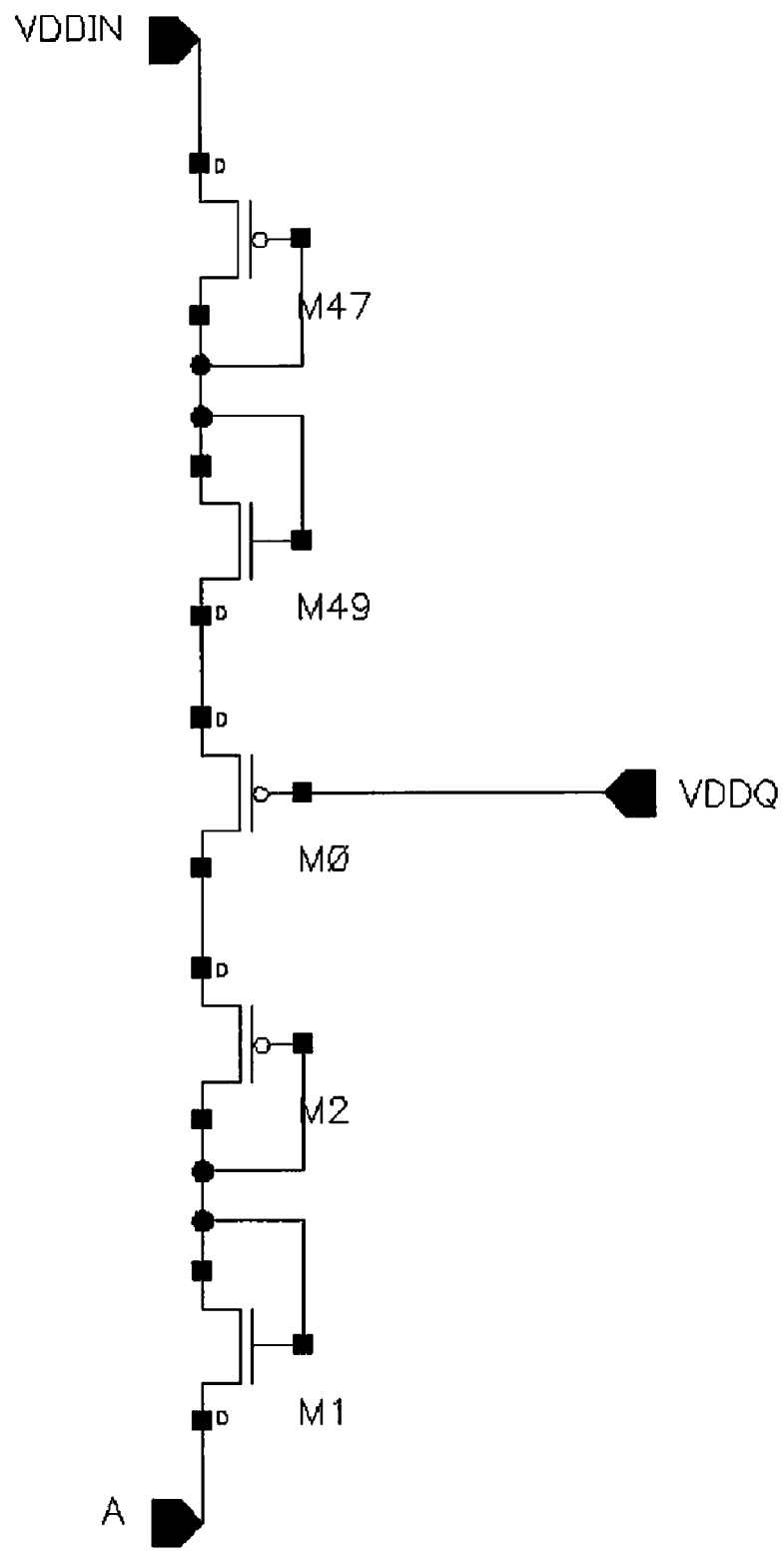
FIG. 3 shows an alternative embodiment of the circuit arrangement according to the present invention.

An alternative and also preferred embodiment is illustrated in FIG. 3. The value of Vcomm may be reduced by introducing one or more transistors connected as diodes in series to the transistor TR1, as depicted in FIG. 3. Diode-connected transistors may be connected toward the VDDIN node and/or toward the ground node. The approach described herein substantially enhances the power on reliability in a dual power supply digital device with an internal down converter by permitting even a non-simultaneous application of the two externally applied power supply voltages VDDQ and VDD without any spurious consequences.

The invention claimed is:

1. A dual power supply device comprising:
   a down converter for converting an externally applied supply voltage to a regulated first supply voltage;
   at least one input/output pad;
   at least one first input buffer coupled to said at least one input/output pad and being powered by a second supply voltage;
   a voltage translator latch stage being powered by the regulated first supply voltage for replicating a stored inverted replica of a logic value on said at least one input/output pad onto a node;
   at least one second input buffer coupled to the node and being powered by the regulated first supply voltage; and
   at least one coupling transistor for coupling the node to the regulated first supply voltage, said at least one coupling transistor having a switching threshold and a control terminal connected to the second supply voltage.

2. The dual power supply device according to claim 1, further comprising at least one diode-connected transistor coupled in series with said at least one coupling transistor for adjusting the switching threshold thereof.

3. The dual power supply device according to claim 1, further comprising a dedicated pad for receiving the second supply voltage that is externally generated.

4. A digital device comprising:
   logic circuitry;
   a down converter for converting an externally applied supply voltage to a regulated first supply voltage for powering said logic circuitry;
   at least one input/output pad;
   at least one first input buffer coupled to said at least one input/output pad and being powered by a second supply voltage;
   a voltage translator latch stage receiving the regulated first supply voltage for replicating a stored inverted replica of a logic value on said at least one input/output pad onto a node;
   at least one second input buffer coupled to the node and being powered by the regulated first supply voltage; and
   at least one coupling transistor for coupling the node to the regulated first supply voltage, said at least one coupling transistor having a switching threshold and having a control terminal connected to said second supply voltage.

5. The digital device according to claim 4, further comprising at least one diode-connected transistor coupled in series with said at least one coupling transistor for adjusting the switching threshold thereof.

6. The digital device according to claim 4, further comprising a dedicated pad for receiving the second supply voltage that is externally generated.

7. A method for operating a dual power supply device comprising at least one input/output pad, at least one first input buffer coupled to the at least one input/output pad, a voltage translator latch stage coupled to a node, and at least one second input buffer coupled to the node, the method comprising:

converting an externally applied supply voltage to a regulated first supply voltage for powering the voltage translator latch stage and the at least one second input buffer;

providing a second supply voltage for powering the at least one first input buffer;

operating the voltage translator latch stage for replicating a stored inverted replica of a logic value on the at least one input/output pad onto the node; and coupling the node to the regulated first supply voltage using at least one coupling transistor, the at least one coupling transistor having a switching threshold and a control terminal connected to the second supply voltage.

8. The method according to claim 7, wherein the dual power supply device further comprises at least one diode-connected transistor coupled in series with the at least one coupling transistor for adjusting the switching threshold thereof.

9. The method according to claim 7, wherein the dual power supply device further comprises a dedicated pad for receiving the second supply voltage that is externally generated.

* * * * *